(12) United States Patent
Bridges et al.

(10) Patent No.: US 6,377,066 B1
(45) Date of Patent: Apr. 23, 2002

(54) METHOD AND APPARATUS FOR SUB-MICRON IMAGING AND PROBING ON PROBE STATION

(75) Inventors: Greg E. Bridges; Douglas J. Thomson, both of Winnipeg (CA)

(73) Assignee: MFI Technologies Corporation, San Jose, CA (US)

( * ) Notice: Subject to any disclaimer, the term of this patent is extended or adjusted under 35 U.S.C. 154(b) by 0 days.

(21) Appl. No.: 09/610,668

(22) Filed: Jul. 5, 2000

Related U.S. Application Data (60) Provisional application No. 60/143,182, filed on Jul. 9, 1999.

(51) Int. Cl.[7] ............................................... G01R 31/26
(52) U.S. Cl. ..................................................... 324/765
(58) Field of Search ................................ 324/765, 763, 324/761, 762; 73/105

(56) References Cited

U.S. PATENT DOCUMENTS

| | | |
|---|---|---|
| 5,612,491 A | 3/1997 | Lindsay |
| 5,959,447 A | 9/1999 | Bridges et al. |
| 5,959,458 A | 9/1999 | Talbot |
| 5,983,712 A * | 11/1999 | Lindsay et al. ................ 73/105 |
| 6,091,248 A | 7/2000 | Hellemans et al. |

* cited by examiner

Primary Examiner—N. Le
Assistant Examiner—James Kerveros
(74) Attorney, Agent, or Firm—Blakely Sokoloff Taylor & Zafman, LLP (57) ABSTRACT

A sub-micron probe apparatus to be added to an existing probe station. In one embodiment, the probe apparatus includes a course positioning unit to be optionally mounted or added to an existing probe station platform. A fine positioning unit is attached to an arm attached to the course positioning unit. A cantilever having a tip is attached to a support structure attached to the fine positioning unit. The course and fine positioning units are used to place the cantilever and tip over a surface of a device under test (DUT). Motion of the cantilever is detected with a motion sensor. An image of the surface of the DUT may be obtained. In addition, an electrical signal carried in an electrical trace on or near the surface of the DUT can be detected. An electrical signal may also be supplied to the electrical trace on or near the surface of the DUT. The field of vision of an optical imager used to image the DUT at the probe area is not obstructed by the probe apparatus.

33 Claims, 5 Drawing Sheets

METHOD AND APPARATUS FOR SUB-MICRON IMAGING AND PROBING ON PROBE STATION

RELATED APPLICATION

This application claims priority to U.S. provisional application serial No. 60/143,182, filed Jul. 9, 1999, entitled "Sub-Micron Imaging Probe Station."

BACKGROUND OF THE INVENTION

1. Field of the Invention

The present invention relates generally to the stimulus and measurement of electrical signals on microelectronic devices. Specifically, to providing the imaging of and electrical measurements on microelectronic devices for purposes that include device characterization, testing and failure analysis.

2. Background Information

The microelectronics field is a multi-billion dollar industry that is driving rapid technological advances in the design and fabrication of dense integrated circuits (IC's). The continuing advances are increasing the speed and decreasing the size of devices fabricated on an IC, engendering a new generation of "deep sub-micron" technology, whose circuit elements are substantially smaller than 0.5 $\mu$m. Measuring the performance of these "deep sub-micron" circuit elements (device characterization) and diagnosing the cause of failed IC's (failure analysis) is a continual test and measurement challenge. Device characterization, diagnostics, and failure analysis of advanced microelectronics depends on the ability to stimulate and measure electrical signals at internal circuit points (nodes).

Microelectronic devices are often probed to measure signals at nodes not readily accessible through external connections. Probing has traditionally been accomplished by using a precision testing platform, known as a probe station, for mounting the device-under-test (DUT), mounting manipulators for placing the probes on circuit elements in the DUT, and providing a way to view the area to be tested, normally an optical microscope.

The probes typically include sharpened metal needles or wires to make electrical contact with the device or node of interest. These wire or needle-like structures are usually installed in an arm which allows the tip of the wire or needle to be placed in electrical contact with a particular circuit point, while avoiding contact with other electrical structures necessary to provide power and other signals to the device-under-test (DUT). This arm is often referred to as a probe and the wire or needle-like structure extending from it is known as a probe-tip.

These metal needles or wires are often located at the end of precision manipulators (probe positioners), which are used to accurately place the tip of the needle or wire on the circuit element to be measured or stimulated. Substantial effort has been expended on the design of such probe positioners, since they are used to place the probe-tip precisely on micron-size devices inside the integrated circuit and keep stable contact for many minutes or hours.

The probe manipulators are typically integrated with the probe station. The location of a circuit element of interest and of the probe-tip is determined by viewing both through an optical microscope(s) that are mounted on the probe station. During IC testing or device characterization, several such probes are typically used to probe the internal circuit, and each is placed using the common high-magnification viewing system, a probe station microscope or lens arrangement.

This traditional probe station and needle or wire probe system has sufficed for many years to stimulate and measure signals from the internal nodes of integrated circuits. However, the size of the circuit elements comprising many present day IC's is under 0.5 $\mu$m and cannot be seen using probe station optical microscopes. Under an optical microscope, even at substantial magnification, two 0.5 $\mu$m devices, positioned 0.5 $\mu$m apart, often cannot be resolved. Miniaturization has reduced the dimension/size of microelectronic circuit elements to the point where optical imaging systems are no longer capable of the resolution needed to place probes on the nodes of interest. Simply put, the dimensions of microelectronics have shrunk below the size that can be imaged with optical imaging systems now on probe stations. Additionally, traditional needle or wire probe tips, because of their larger tip diameter, cannot reliably make electrical contact with sub-0.5 $\mu$m circuit elements. When contact can occasionally be made using traditional probe tips, the large capacitance and inductance associated with their size changes the circuit characteristics, altering the true performance of the device or circuit. This effect is known as "probe loading" or "loading" of the DUT by the probe.

Users of present day probe stations often have considerable investment in their probe stations. For instance, there is also enormous investment in the software that controls and coordinates the probe stations. Traditional probe stations are well configured to stimulate devices and mechanical probes are still useful when microelectronic devices have dimensions large enough to be imaged by probe station microscope systems. For many users, replacing their current probe station is a monumental task, causing major delays in the release of new products, and engendering development expenses many times greater than the cost of a probe station.

SUMMARY OF THE INVENTION

A probe apparatus and method are described. In one embodiment, a probe apparatus includes a first positioning unit configured to be optionally added onto a probe station platform. A probe arm is attached to the first positioning unit. A second positioning unit is attached to the probe arm. A cantilever is attached to the second positioning unit. The cantilever includes a tip. The first and second positioning units are configured to position the tip over a device under test (DUT). The probe apparatus includes an electrical signal path from the tip of cantilever. The probe apparatus also includes a motion sensor configured to detect motion of the cantilever. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A sub-micron imaging probe that may be optionally added onto a traditional probe station platform is described. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

The present invention provides a way to preserve a user's investment in traditional probe stations and testing methodologies by enabling these systems to be used in applications where the dimensions of microelectronics make optical sub-micron imaging and placement of the conducting probes difficult and where reduced loading of the microelectronic circuits is desirable. One embodiment of the present invention can be quickly and easily added to a traditional probe station, enabling sub-micron and "deep sub-micron" imaging and probe placement, low-loading electrical measurements. In one embodiment, the present invention is compatible with the custom fixtures and instruments in traditional probe stations normally used in the characterization and testing of integrated circuits.

Figure 1:
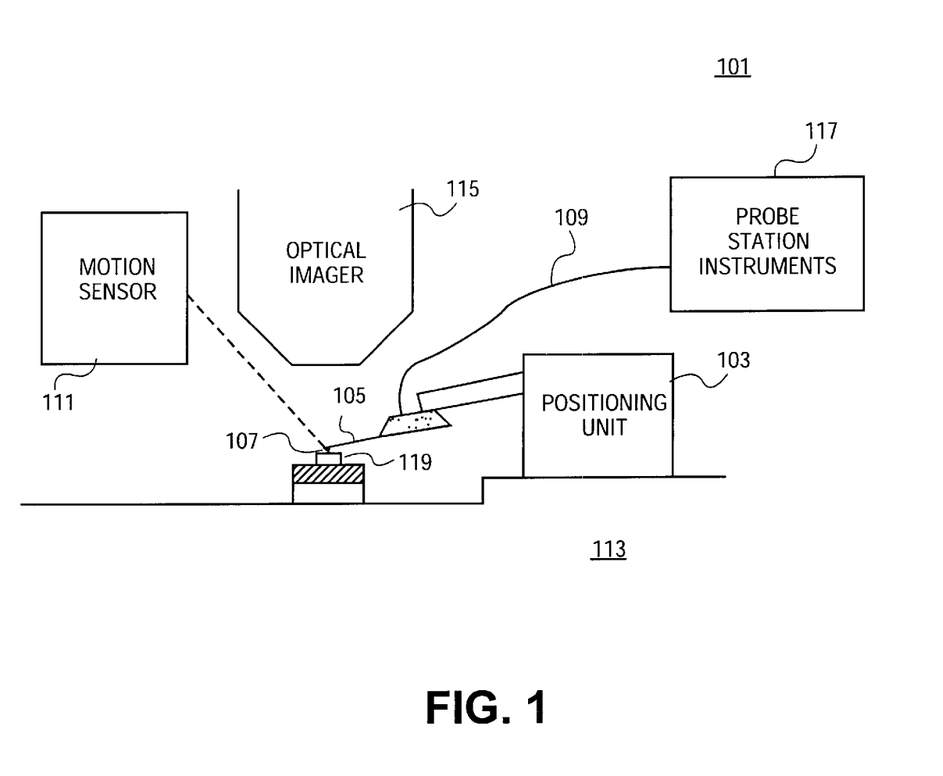
FIG. 1 is a diagram of one embodiment of a probe station including a cantilever motion sensor in accordance with the teachings of the present invention.

FIG. 1 is an illustration of one embodiment of a probe apparatus 101 in accordance with the teachings of the present invention, which includes a micro-machined conducting cantilever 105 and tip 107 mounted such that an electrical signal path 109 is established between the probe tip 107 and the probe station instruments 117. In one embodiment, the cantilever 105 and tip 107 are also mechanically attached to a positioning unit 103, which in one embodiment is an x, y, z motion stage. This positioning unit 103 is in turn optionally mounted or added onto an existing probe station platform 113. In one embodiment, probe station platform 113 is part of a present day traditional probe station. The present invention also includes a motion sensor 111. In one embodiment, motion sensor 111 is configured to sense motion of cantilever 105. Techniques utilized by motion sensor 111 for sensing motion in the cantilever 107 may include, but are not restricted to optical beam bounce, capacitive motion detection, piezo-resistive and optical interferometric techniques.

In one embodiment, the tip 107 is lowered to the surface of device under test (DUT) 119 using the positioning unit 103. In one embodiment, the x, y, z motion of the cantilever 105 and tip 107 are accomplished using piezoelectric elements in positioning unit 103. Contact between the tip 107 and surface of DUT 119 is detected using the motion sensor 111. In one embodiment, once the tip 107 has contacted the surface of DUT 119, tip 107 is then moved over the surface of DUT 119 to produce an image related to the surface topography of DUT 119. If the motion of the tip 107 is measured along with the position of the tip 107, an image related to the surface topography of DUT 119 may be obtained.

Figure 2:
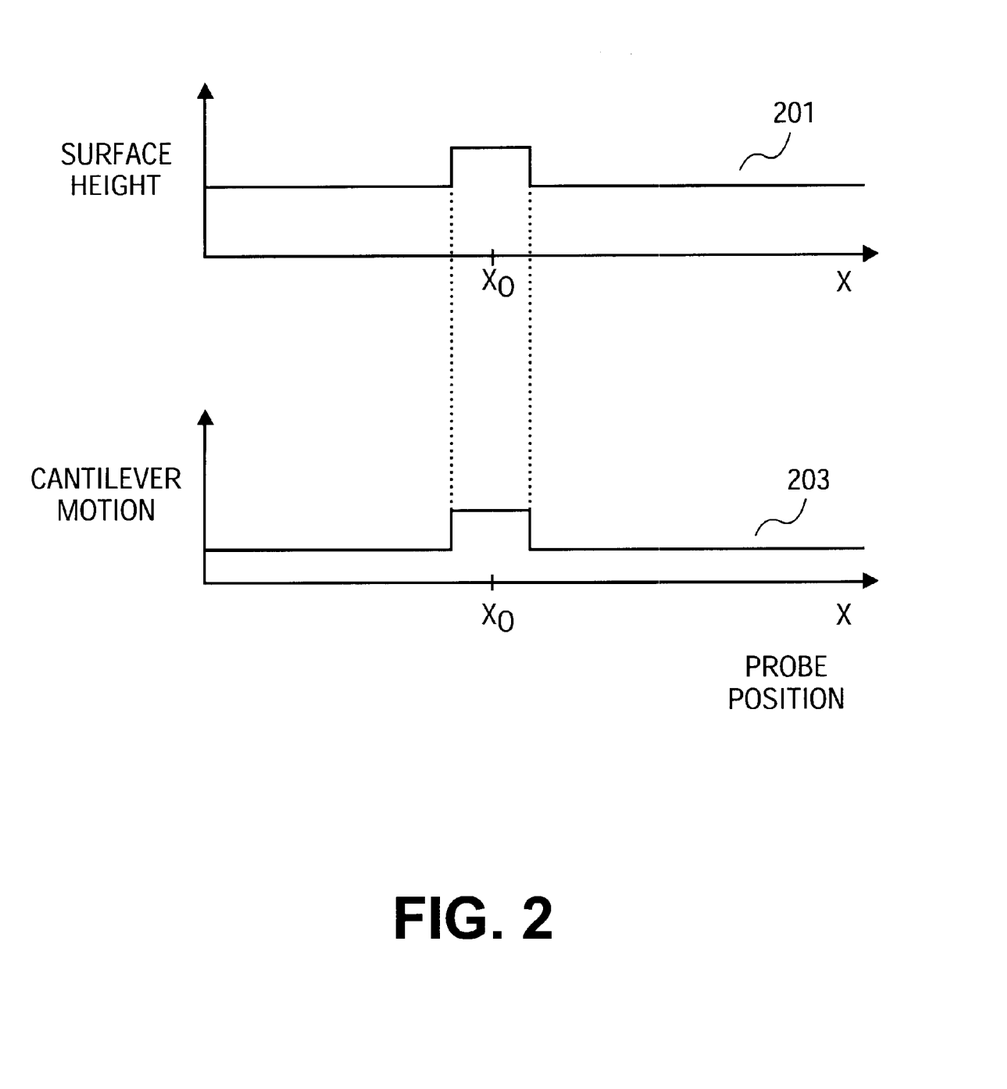
FIG. 2 is a diagram illustrating one embodiment of cantilever motion in relation to the height of a device surface in accordance with the teachings of the present invention.

For example, if an electrical trace exists on the surface of DUT 119 that is higher than the surrounding regions, as shown with surface height 201 in FIG. 2, it will produce a corresponding change in the cantilever motion 203. By monitoring the cantilever motion 201 of the cantilever 105, it can be determined that the center of the electrical trace is located at $x_o$, The tip 107 can then be accurately placed on the electrical trace at $x_o$, and the electrical signal path 109 may be used to either measure an electrical signal contained in the electrical trace or supply an electrical signal or stimulus to the electrical trace. More importantly, since this imaging is accomplished with a micro-machined tip 105, the imaging resolution is only limited by the dimensions of cantilever 105 and tip 107.

The resolution possible with a presently described micro-machined cantilever 105 and tip 107 is significantly better than that achievable with optical imaging systems where the resolution is limited by the wavelength of light, and the numerical aperture of microscope objectives. With present day optical imaging systems, this limits the resolution to about 1 micrometer. In state of the art microelectronics the dimensions of electrical signal traces are less then 0.18 micrometers and hence not able to be imaged with present day probe station optical imaging systems. However, with a presently described micro-machined cantilever 105 and tip 107, it is common to achieve resolutions of less than 10 nm. As tip manufacturing improves this limit is expected to decrease.

Figure 3:
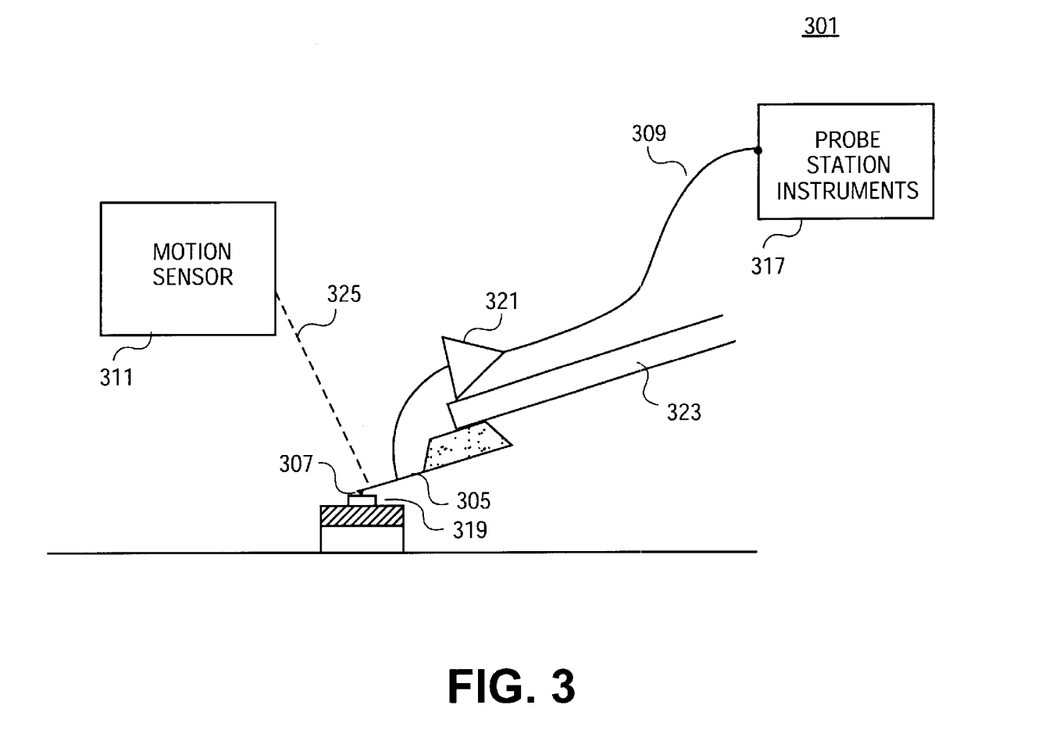
FIG. 3 is a diagram of one embodiment of a probe station including a buffer amplifier in accordance with the teachings of the present invention.

FIG. 3 is an illustration of one embodiment of a probe apparatus 301 including a buffer amplifier 321 included in the electrical signal path 309. As shown, the electrical signal path 309 includes a buffer amplifier 321 in close proximity to the cantilever 305 and tip 307. This allows the signals from the DUT 319 to be buffered from the probe station instruments 317. In one embodiment, the distance between the cantilever 305 and the buffer 321 is reduced to reduce the parasitic loading on the DUT 319. In one embodiment, the cantilever 305 and the buffer amplifier 321 are mounted on the same support structure 323. For instance, if the cantilever 305 is held by an alumina plate support structure 323, then the buffer amplifier 321 also resides on the alumina plate support structure 323. In another embodiment, the support structure 323 could be replaced with any material that would be mechanically suitable to hold the cantilever 305 and provide a suitable electrical substrate to hold the buffer amplifier 321.

In one embodiment, the buffer amplifier 321 is a field effect transistor (FET) input buffer 321. Thus, in one embodiment the electrical signal path 309 includes a FET input buffer 321 in close proximity to the cantilever 305. The use of a FET input buffer 321 in the signal path 309 reduces the electrical load on DUT 319. In one embodiment, the distance between the cantilever 305 and the FET input buffer 321 is reduced to reduce the parasitic loading on the DUT 319. In one embodiment, the cantilever 305 and the FET input buffer 321 are mounted on the same support structure 323. For instance, if the cantilever 305 is held by an alumina plate support structure 323, then the FET input buffer 321 also resides on the alumina plate support structure 323. In another embodiment, the alumina plate support structure 323 could be replaced with any material that would be mechanically suitable to hold the cantilever 305 and provide a suitable electrical substrate to hold the FET input buffer 321.

In another embodiment, the signal path 309 includes a series resistor (not shown) in close proximity to the cantilever 305. The use of a series resistor in the electrical signal path 309 reduces the electrical load on the DUT 319. In one embodiment, the distance between the cantilever 305 and the series resistor is reduced to reduce the parasitic loading on the DUT 319. In one embodiment, the cantilever 305 and the series resistor are mounted on the same support structure 323. For instance, if the cantilever 305 is held by an alumina plate support structure 323, then the series resistor also resides on the alumina plate support structure 323. The alumina plate of support structure 323 could of course be replaced by any material that would be mechanically suitable to hold the cantilever 305 and provide a suitable electrical substrate to hold the series resistor.

As also shown in FIG. 3, a cantilever motion sensor 311 may be used in one embodiment to sense motion in the cantilever 305. In one embodiment, the cantilever 305 motion is sensed using a light beam 325 bounce technique. In one embodiment of the motion sensor 311, a beam of light 325 is directed onto the cantilever 305. When the cantilever 305bends, the angle at which the light beam 325 reflects off the cantilever 305 changes. Motion sensor 311 can sense this change in angle can then be used to detect cantilever 305 motion. In one embodiment, the change in angle may be detected using a bicell photodiode.

In an embodiment in which the motion sensor 311 utilizes a light bounce technique to detect motion of the cantilever 305, a light beam 325 is directed onto the cantilever 305. In one embodiment, a motorized mechanical slide (not shown) can be used to translate the light beam 325 and direct it onto the cantilever 305. In one embodiment, the mechanical slide can also be adjusted by hand, but this will result in a significant motion of the cantilever 305. Consequently, if the cantilever 305 is in close proximity to the DUT 319 or other probes, this could result in damage to the cantilever 305 or to the DUT 319. Thus, the use of a motorized light positioning mechanism in accordance with the teachings of the present invention significantly reduces the motion of the cantilever 305 while the light beam 325 is being adjusted. The use of a motorized light beam positioner also allows the light beam 325 to be automatically positioned on the cantilever 305 without the need for operator intervention. This significantly decreases the need for operator training.

In one embodiment, the light beam 325 that is directed onto the cantilever 305 is reflected off the cantilever and into a light beam angle detector included in motion sensor 311. In one embodiment, a motorized mechanical slide can be used to translate the light beam 325 angle detector so that it intercepts the reflected light beam 325. In one embodiment, the mechanical slide (not shown) can also be adjusted by hand, but this will result in a significant motion of the cantilever 305. Consequently, if the cantilever 305 is in close proximity to the DUT 319 or other probes this could result in damage to the cantilever 319 or to the DUT 319. Thus, the use of a motorized light beam angle detector positioning mechanism in accordance with the teachings of the present invention significantly reduces the motion of the cantilever 305 while the light beam angle detector is being adjusted. The use of a motorized light beam angle detector positioner also allows the light beam angle detector to automatically positioned without the need for operator intervention. This significantly decreases the need for operator training.

In another embodiment, the motion of the cantilever 305 is sensed by the optical interference of a light beam 325 reflected off the cantilever 305 with a reference light beam (not shown). As the cantilever 305 deflects light beam 305, the phase difference between the light beam 325 and the reference light beam will change. If the light beams are substantially a single frequency of light, then the amplitude of the two beams when added vary as the phase difference between them changes. In this way the motion of the cantilever can be detected.

In yet another embodiment, cantilever 305 motion may be detected using a piezo resistive motion sensor. For example, in one embodiment, the cantilever motion is sensed using a resistor (not shown) in the cantilever. When the cantilever 305 bends, the resistance changes. A cantilever motion sensor that can detect a change in resistance may be used to detect cantilever motion. In one embodiment, the change in resistance is detected using a bridge-circuit.

In still another embodiment, the motion sensor 311 includes an electrode (not shown) in close proximity to the cantilever 305 to sense cantilever 305 motion. In particular, when the cantilever 305 bends, the spacing between the electrode and the cantilever 305 will change. This will result in a change in the capacitance between the electrode and the cantilever 305. The motion sensor 311 can sense this change, which can then be used to detect cantilever 305 motion. In one embodiment, a bridge circuit could be used to detect changes in capacitance.

In one embodiment, imaging is accomplished using non-contact forces between the cantilever 305 and DUT 319. In particular, if a potential difference exists between the cantilever 305 and an electrical trace in DUT 319, then an attractive force between the cantilever 319 and the trace in DUT 319 will be generated. This force will generate motion in the cantilever 305. As the cantilever 305 moves away from the trace in DUT 319, this force will decrease and hence the motion of the cantilever 305. Thus, the electrostatic force can be used to determine the position of the trace for tip 307placement. In another embodiment, the magnetic forces generated between a magnetic moment on the cantilever 305 and the magnetic fields generated by current passing through the electrical trace in DUT 319 can be used for placing the tip 307.

Figure 4:
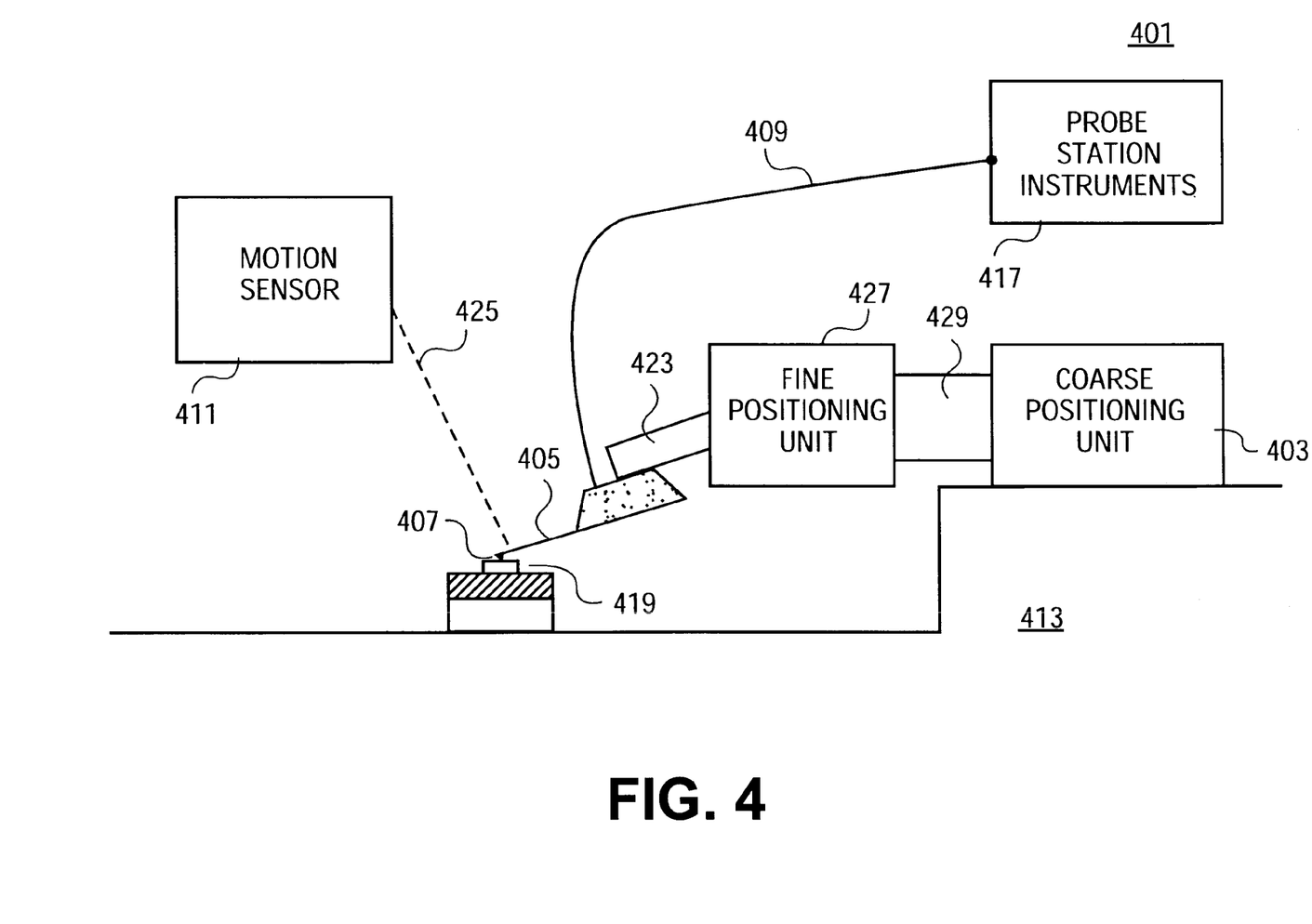
FIG. 4 is a diagram of one embodiment of a probe station including a coarse positioner and a fine positioner in accordance with the teachings of the present invention.

FIG. 4 is an illustration of one embodiment of a probe apparatus 401 including a coarse positioning unit 403 and a fine positioning unit 427 optionally attached to a probe station stage 413 in accordance with the teachings of the present invention. In one embodiment, a fine positioning unit 427 is on the end of arm 429 attached to course positioning unit 403, with the coarse positioning unit 403 optionally attached to probe station stage 413. In one embodiment, a coarse x, y, z positioner is included in coarse positioning unit 403. An arm 429 is attached to and extends from the coarse positioning unit 403. A fine positioning unit 427 is located at the end of the arm 429 and is used for fine x, y, z positioning of the cantilever 405, which is attached to support structure 423. The coarse positioning unit 403 can be used to position the cantilever 405 and tip 407 within the range of motion of the fine positioning unit 427.

In one embodiment, mechanical screws are used for coarse positioning unit 403 to allow the cantilever 405 to be positioned over distances of many centimeters. It is noted that the mechanisms used for coarse positioning unit 403 in one embodiment are slow and have poor resolution. However, in one embodiment, since the mass of the cantilever 405 and the support structure 423 are small, they can be positioned quickly by the fine positioning unit with high resolution. In one embodiment, piezoelectric positioners in fine positioning unit 427 are used and resolutions of less than 10 nm are readily achieved.

It is noted that in one embodiment, if the fine positioning unit 427 is located on the probe station platform 413 via the coarse positioning unit 403, the cantilever 405 cannot be positioned quickly without inducing unwanted vibration of the arm 429 and cantilever 405. In one embodiment, the fine positioning is accomplished using piezoelectric positioners in the fine positioning unit 427. In another embodiment, the fine positioning is accomplished using voice coil positioners in the fine positioning unit 427. In still another embodiment, the fine positioning is accomplished using electrostrictive positioners in the fine positioning unit 427. In one embodiment, the coarse positioning is accomplished using ball bearing slides and fine pitched mechanical screws in the coarse positioning unit 403. In another embodiment, coarse positioning is accomplished using mechanical slides and stepper motor driven screws in the coarse positioning unit 403. It is appreciated that the embodiments listed above are given for explanation purposes and that there are of course many ways to accomplish the coarse positioning which will not significantly deviate from the concept presented above.

In one embodiment, the cantilever 405 is made of a solid conductor. One advantage of this type of cantilever is that there is low resistance path between the DUT 419 and the electrical signal path 409. In another embodiment, the cantilever 405 includes a conducting coating on another material. For example, in one embodiment, the cantilever 405 is coated with a conducting film such as for example but not limited to diamond or metal. The cantilever 405 material can be chosen for its mechanical properties such as elastic constant and resistance to plastic deformation and the conducting coating can be chosen for its electrical properties. In one embodiment, the cantilever 405 is made out of silicon and the conducting coating a titanium-tungsten alloy.

Figure 5:
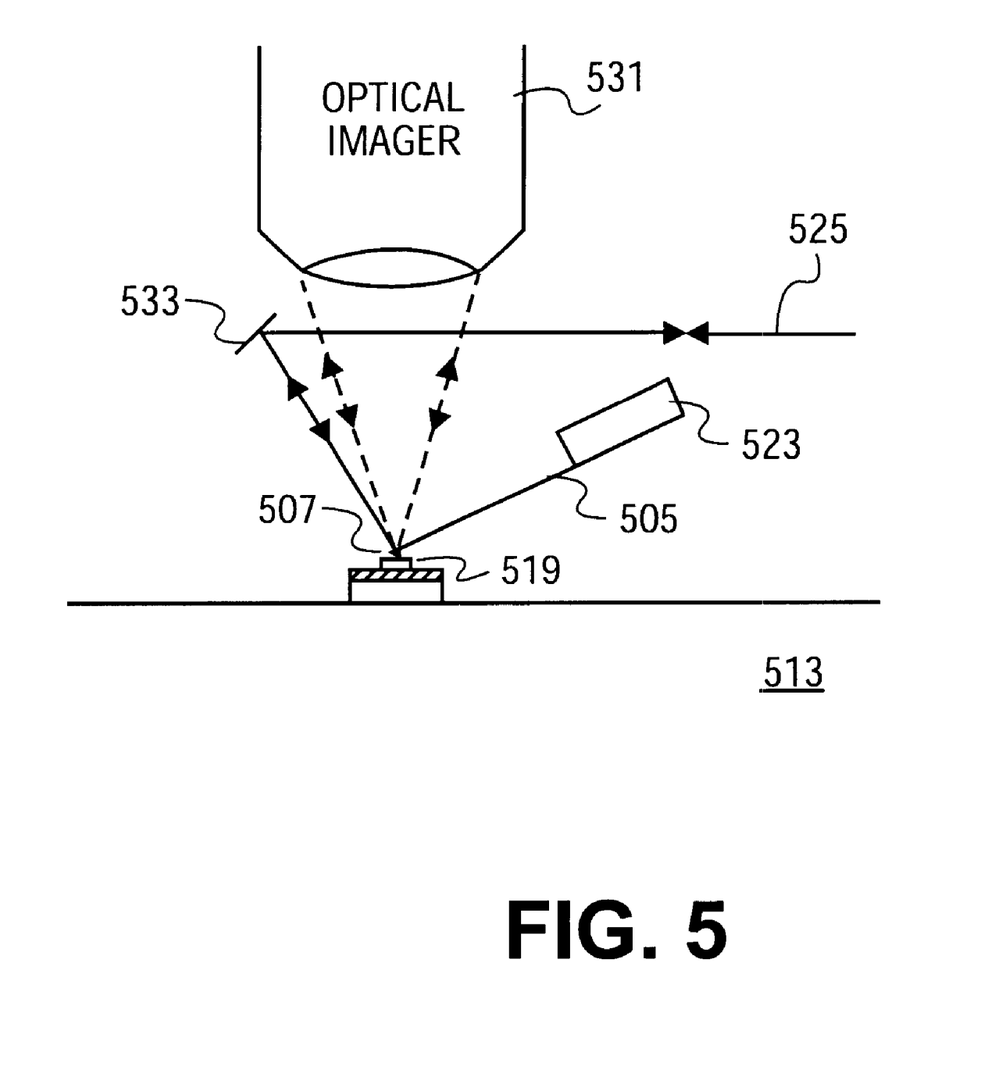
FIG. 5 is a diagram of one embodiment of a probe station including light path optics out of the field of vision of an optical imaging system in accordance with the teachings of the present invention.

FIG. 5 is an illustration showing one embodiment of a cantilever support structure 523 and mirror 533 that do not interfere with the field of vision of an optical microscope objective lens of an optical imager 531. When the light bounce embodiment described above is used to detect the motion of the cantilever 505, the light beam 525 has a path from the source of the light beam to the cantilever 505 and the reflected light has a path to an angle detector (not shown). It is also important to be able to view the sample with the probe station optical imaging system 531 for coarse positioning of the DUT 519 on probe station stage 513 and the cantilever 505 and tip 507.

In one embodiment, the optical path to and from the cantilever 505 is set up such that the optical elements of the light beam optical path, including mirror 533, do not interfere with the field of view or optical path of the probe station optical imager 531. In one embodiment, a mirror 533 used to direct the light beam 525 onto the cantilever 505 and then direct the reflected light beam 525 back to the angular position sensor is placed outside the field of view for the probe station optical imager 531.

In one embodiment the deflection motion sensor (not shown) is such that it does not interfere with the operation of other probes. Deflection sensors can often interfere with the operation of other probes. In the capacitance-based technique the electrode in close proximity to the cantilever may restrict the movement of other probes. In particular it may prevent two probes from probing devices in close proximity to one another. In one embodiment, the electrode in the capacitance based motion sensor is placed above the cantilever such that it does not interfere with the movement of other probes.

In one embodiment, vibration of the probe tip 507 relative to the surface of DUT 519 is reduced by use of a control system, which dynamically adjusts the displacement at the tip 507. In another embodiment, motion of the tip 507 relative to the surface of DUT 519 due to thermal expansion and contraction of mechanical elements is reduced by matching the probe materials to the probe station or probe system materials. In another embodiment, motion of the tip 507 relative to the surface of DUT 519 due to thermal expansion and contraction of mechanical elements is reduced by measuring the temperature of the probe and its environment. In one embodiment, the probe tip 519 position is then automatically adjusted (using for example software) to reduce displacement relative to the surface.

In the foregoing detailed description, the method and apparatus of the present invention has been described with reference to specific exemplary embodiments thereof. However, it will be evident that various modifications and changes may be made thereto without departing from the broader spirit and scope of the present invention. The present specification and figures are accordingly to be regarded as illustrative rather than restrictive.

What is claimed is:

1. A probe apparatus, comprising:
   a first positioning unit to be mounted onto an existing probe station platform of a probe station with probing capability so as to provide additional probing capability to the probe station;
   a probe arm attached to the first positioning unit;
   a second positioning unit attached to the probe arm;
   a cantilever attached to the second positioning unit, the cantilever having a tip, the first and second positioning units configured to position the tip over a device under test (DUT), the probe apparatus including an electrical signal path between the tip of cantilever and probe station user instruments; and
   a motion sensor configured to detect motion of the cantilever.

2. The probe apparatus of claim 1 wherein the cantilever is micro-machined.

3. The probe apparatus of claim 1 wherein the first positioning unit comprises mechanical screws.

4. The probe apparatus of claim 1 wherein the second positioning unit comprises piezoelectric elements.

5. The probe apparatus of claim 1 wherein the second positioning unit comprises voice coil positioners.

6. The probe apparatus of claim 1 wherein motion of the cantilever is used to obtain an image of a surface of the DUT.

7. The probe apparatus of claim 6 wherein non-contact forces between the cantilever and the DUT are measured to obtain the image.

8. The probe apparatus of claim 1 wherein motion of the cantilever is used to detect a signal in an electrical trace of the DUT.

9. The probe apparatus of claim 1 wherein the cantilever is used to supply a signal to an electrical trace of the DUT from the probe station user instruments.

10. The probe apparatus of claim 1 further comprising a buffer amplifier included in the electrical path from the tip the cantilever.

11. The probe apparatus of claim 10 wherein the cantilever is attached to a support structure attached to the second positioning unit, wherein the buffer amplifier is mounted on the on the support structure.

12. The probe apparatus of claim 10 wherein the buffer amplifier comprises a field effect transistor (FET) input buffer in relatively close proximity to the cantilever.

13. The probe apparatus of claim 1 further comprising a series resistor included in the electrical path from the tip the cantilever.

14. The probe apparatus of claim 13 wherein the cantilever is attached to a support structure attached to the second positioning unit, wherein the series resistor is mounted on the on the support structure.

15. The probe apparatus of claim 1 wherein the motion sensor utilizes a light bounce technique to detect motion of the cantilever.

16. The probe apparatus of claim 15 further comprising a mirror optically coupled between the cantilever and the motion sensor.

17. The probe apparatus of claim 16 wherein the mirror is positioned so as not to interfere with an optical path of an optical imaging system positioned to optically view the DUT.

18. The probe apparatus of claim 1 wherein the motion sensor senses optical interference of a light beam deflected off the cantilever with a reference light beam to detect motion of the cantilever.

19. The probe apparatus of claim 1 wherein the motion sensor senses a change in resistance of a resistor in the cantilever to detect motion of the cantilever.

20. The probe apparatus of claim 1 wherein the motion sensor senses a change in capacitance between the cantilever and an electrode positioned near the cantilever to detect motion of the cantilever.

21. The probe apparatus of claim 1 wherein the cantilever comprises a solid conductor.

22. The probe apparatus of claim 1 wherein the cantilever comprises a conducting material on another material.

23. A method for probing a device under test (DUT), comprising:

mounting a probe apparatus to an existing probe station platform of a probe station with probing capability so as to provide additional probing capability to the probe station;

coarsely positioning with a first positioning unit of the probe apparatus a tip of a cantilever of the probe apparatus over a surface of the DUT;

finely positioning with a second positioning unit attached to the first positioning unit the tip of the cantilever of the probe apparatus over the surface of the DUT; and sensing motion of the cantilever.

24. The method for probing the DUT of claim 23 further comprising obtaining an image of the surface of the DUT.

25. The method for probing the DUT of claim 23 further comprising obtaining a signal in an electrical trace of the DUT.

26. The method for probing the DUT of claim 25 further comprising buffering the signal in the electrical trace of the DUT with a buffer amplifier included an electrical path from the tip of the cantilever relatively close to the tip of the cantilever.

27. The method of probing the DUT of claim 23 wherein sensing motion of the cantilever comprises:

reflecting light from the cantilever; and detecting a change in an angle at which the light reflected from the cantilever.

28. The method of probing the DUT of claim 23 wherein sensing motion of the cantilever comprises detecting a change in a resistance of the cantilever responsive to a bending of the cantilever.

29. The method of probing the DUT of claim 23 wherein sensing motion of the cantilever comprises detecting a change in a capacitance between the cantilever and an electrode in close proximity to the cantilever, the change in the capacitance responsive to a bending of the cantilever.

30. A probe apparatus, comprising:

first positioning means for coarse positioning mounted to an existing probe station platform of a probe station with probing capability so as to provide additional probing capability to the probe station;

a probe arm attached to the coarse positioning means;

second positioning means for fine positioning attached to the probe arm;

a cantilever attached to the second positioning unit, the cantilever having a tip, the first and second positioning units configured to position the tip over a device under test (DUT), the probe apparatus including an electrical signal path between the tip of cantilever and probe station user instruments; and motion sensor means configured to detect motion of the cantilever.

31. The probe apparatus of claim 30 wherein the electrical signal path includes buffer means relatively close to the tip of the cantilever for buffering an electrical signal from tip of the cantilever.

32. The probe apparatus of claim 30 wherein the electrical signal path includes resistive means relatively close to the tip of the cantilever for reducing a load on the DUT resulting from the cantilever.

33. The probe apparatus of claim 30 wherein the motion sensor means includes reflecting means for reflecting light reflected from the cantilever.

* * * * *

US006377066C1

(12) INTER PARTES REEXAMINATION CERTIFICATE (0049th)
United States Patent
Bridges et al.

(10) Number: US 6,377,066 C1
(45) Certificate Issued: Feb. 17, 2009

(54) METHOD AND APPARATUS FOR SUB-MICRON IMAGING AND PROBING ON PROBE STATION (75) Inventors: Greg E. Bridges, Winnipeg, CA (US); Douglas J. Thomson, Winnipeg, CA (US)

(73) Assignee: Suss Microtec Test Systems GmbH, Sacka (DE)

Reexamination Request:
No. 95/000,091, May 2, 2005

Reexamination Certificate for:
Patent No.: 6,377,066
Issued: Apr. 23, 2002
Appl. No.: 09/610,668
Filed: Jul. 5, 2000

Related U.S. Application Data

(60) Provisional application No. 60/143,182, filed on Jul. 9, 1999.

(51) Int. Cl.
*G01R 1/67* (2006.01)
*G01R 31/311* (2006.01)
*G01R 31/28* (2006.01)

(52) U.S. Cl. .................. 324/765; 977/732; 977/873; 977/901; 977/953

(58) Field of Classification Search .................. None
See application file for complete search history.

(56) References Cited

U.S. PATENT DOCUMENTS

| 4,544,889 A | 10/1985 | Hendriks et al. |
| 4,866,271 A | 9/1989 | Ono et al. |
| 4,962,480 A | 10/1990 | Ooumi et al. |
| 4,992,728 A | 2/1991 | McCord et al. |
| 5,015,850 A | 5/1991 | Zdeblick et al. |
| 5,214,389 A | 5/1993 | Cao et al. |
| 5,225,776 A | 7/1993 | Dobos et al. |
| 5,331,275 A | 7/1994 | Ozaki et al. |
| 5,381,101 A | 1/1995 | Bloom et al. |
| 5,612,491 A | 3/1997 | Lindsay |
| 5,656,769 A | 8/1997 | Nakano et al. |
| 5,808,302 A | 9/1998 | Binnig et al. |
| 5,959,447 A | 9/1999 | Bridges et al. |
| 5,959,458 A | 9/1999 | Talbot |
| 6,091,248 A | 7/2000 | Hellemans et al. |

FOREIGN PATENT DOCUMENTS

EP 0433604 A 6/1991

OTHER PUBLICATIONS

Wickramashinghe, H. Kumar, "Scanned–Probe Microscopes," Scientific American, Scientific American Inc., New York, United States, Oct. 1989, pp. 98–105.
International Search Report for PCT/US00/18711.
Supplementary Search Report for EP 00 94 8604.
M.A. McCord, "An x–y–z stage for scanning proximity microscopes using elastic elements," 1991 American Institute of Physics, Rev. Sci. Instrum. 62 (2), Feb. 1991, pp. 530–531.

(Continued)

*Primary Examiner*—Albert J Gagliardi (57) ABSTRACT

A sub-micron probe apparatus to be added to an existing probe station. In one embodiment, the probe apparatus includes a course positioning unit to be optionally mounted or added to an existing probe station platform. A fine positioning unit is attached to an arm attached to the course positioning unit. A cantilever having a tip is attached to a support structure attached to the fine positioning unit. The course and fine positioning units are used to place the cantilever and tip over a surface of a device under test (DUT). Motion of the cantilever is detected with a motion sensor. An image of the surface of the DUT may be obtained. In addition, an electrical signal carried in an electrical trace on or near the surface of the DUT can be detected. An electrical signal may also be supplied to the electrical trace on or near the surface of the DUT. The field of vision of an optical imager used to image the DUT at the probe area is not obstructed by the probe apparatus.

OTHER PUBLICATIONS

G. E. Bridges, R. A. Said, M. Mittal, and D. J. Thomson, "Sampled waveform measurement in integrated circuits using heterodyne electrostatic force microscopy," 1994 American Institute of Physics, Rev. Sci. Instrum. 65 (11), Nov. 1994, pp. 3378–3381.

G. E. Bridges, R. A. Said, M. Mittal, and D. J. Thomson, "High–frequency pattern extraction in digital integrated circuits using scanning electrostatic force microscopy," 1995 American Vacuum Society, J. Vac. Sci. Technol. B 13(3), May/Jun. 1995, pp. 1375–1379.

Thomas R. Albrecht and Calvin F. Quate, "Atomic resolution with the atomic force microscope on conductors and nonconductors", J. Vac. Sci. Technol. A 6 (2), Mar./Apr. 1988, pp. 271–274.

Y. Martin, C. C. Williams, and H. K. Wickramasinghe, "Atomic force microscope—force mapping and profiling on a sub 100–Å scale", J. Appl. Phys. 61 (10), May 15, 1987, pp. 4723–4729.

M. Tortonese, R. C. Barrett, and C. F. Quate, "Atomic resolution with an atomic force microscope using piezoresistive detection", Appl. Phys. Lett. 62 (8), Feb. 22, 1993, pp. 834–836.

Gabi Neubauer, Sidney R. Cohen, Gary M. McClelland, Don Horne, and C. Matthew Mate, "Force microscopy with a bidirectional capacitance sensor", Rev. Sci. Instrum. 61 (9), Sep. 1990, pp. 2296–2308.

Laurie Ann Peach, "Near–field microscopy maps semiconductors", Laser Focus World, Jan. 1977, Retrieved from the Internet on Feb. 17, 2005, Retrieved from http://ifw.pennnet.com/Articles/Article_Display.cfm?Section=ARCHI&ARTICLE_ID=29956&VERSION_NUM=1.

U. Hartmann, "An Elementary Introduction to Atomic Force Microscopy and Related Methods" Institute of Experimental Physics, University of Saarbrücken, Germany, Jul. 1997, pp. i–57.

J. N. Nxumalo, Y. Li, and D. J. Thomson, "Advances in Cross–Sectional Analysis of Semiconductor Devices Using Contact Resistance Measurements", 4$^{th}$ International Workshop—Measurement, Characterization & Modeling of Ultra–Shallow Doping Profiles, Apr. 1997, 5 pages.

Collection of marketing materials published by GGB Industries Inc. in Sep. and Nov. 1983, 3 pages.

Robert Pool, "The Children of the STM", Science vol. 247, Feb. 9, 1990, pp. 634–636.

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1–33 are cancelled.

* * * * *